(12) United States Patent  (10) Patent No.: US 9,263,624 B2
Moon et al.  (45) Date of Patent: Feb. 16, 2016

(54) HIGH-OUTPUT APPARATUS FOR MANUFACTURING A POLYCRYSTAL SILICON INGOT FOR A SOLAR CELL

(75) Inventors: Sang Jin Moon, Daejeon (KR); Won Wook So, Daejeon (KR); Myung Hoee Koo, Taejeon (KR); Dong Soon Park, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 617 days.

(21) Appl. No.: 13/643,422

(22) PCT Filed: Apr. 5, 2011

(86) PCT No.: PCT/KR2011/002357
§ 371 (c)(1),
(2), (4) Date: Oct. 25, 2012

(87) PCT Pub. No.: WO2011/136479
PCT Pub. Date: Nov. 3, 2011

(65) Prior Publication Data
US 2013/0036769 A1    Feb. 14, 2013

(30) Foreign Application Priority Data
Apr. 29, 2010   (KR) .................. 10-2010-0040101

(51) Int. Cl.
| | |
|---|---|
| H01L 31/00 | (2006.01) |
| H01L 31/18 | (2006.01) |
| C30B 17/00 | (2006.01) |
| C30B 11/00 | (2006.01) |
| C30B 28/06 | (2006.01) |
| C30B 29/06 | (2006.01) |

(52) U.S. Cl.
CPC ............ *H01L 31/182* (2013.01); *C30B 11/002* (2013.01); *C30B 11/003* (2013.01); *C30B 17/00* (2013.01); *C30B 28/06* (2013.01); *C30B 29/06* (2013.01); *Y02E 10/546* (2013.01); *Y02P 70/521* (2015.11)

(58) Field of Classification Search
CPC combination set(s) only.
See application file for complete search history.

(56) References Cited

U.S. PATENT DOCUMENTS

| | | | |
|---|---|---|---|
| 2007/0283882 A1* | 12/2007 | Cho et al. .................... | 117/204 |
| 2008/0311417 A1* | 12/2008 | Eichler et al. ............... | 428/544 |
| 2009/0090296 A1* | 4/2009 | Gil ........................ | C30B 11/002 117/200 |
| 2011/0220012 A1* | 9/2011 | Wu ....................... | C30B 11/003 117/81 |

FOREIGN PATENT DOCUMENTS

| | | |
|---|---|---|
| JP | 2006-335582 | 12/2006 |
| JP | 2007-099579 | 4/2007 |
| KR | 10-2007-0118945 | 12/2007 |
| KR | 10-2009-0035336 | 4/2009 |

* cited by examiner

*Primary Examiner* — Duy Deo
*Assistant Examiner* — Erin Bergner
(74) *Attorney, Agent, or Firm* — Lucas & Mercanti, LLP

(57) ABSTRACT

The present invention relates to a high-output apparatus for manufacturing a polycrystal silicon ingot for a solar cell, and more particularly, to an apparatus for manufacturing a polycrystal silicon ingot by means of heating and melting raw silicon in a vacuum chamber, and then cooling the molten silicon, wherein the apparatus comprises: a plurality of crucibles arranged so as to be horizontally separated from one another within the vacuum chamber, and in each of which raw silicon is filled for manufacturing polycrystal silicon ingots; heating means provided at the outside of each of the crucibles so as to heat each crucible and melt the raw silicon filled therein; and cooling means for cooling the crucibles, so as to enable the silicon melted by the heating means to be cooled in one direction and be formed into polycrystal ingots.

9 Claims, 6 Drawing Sheets

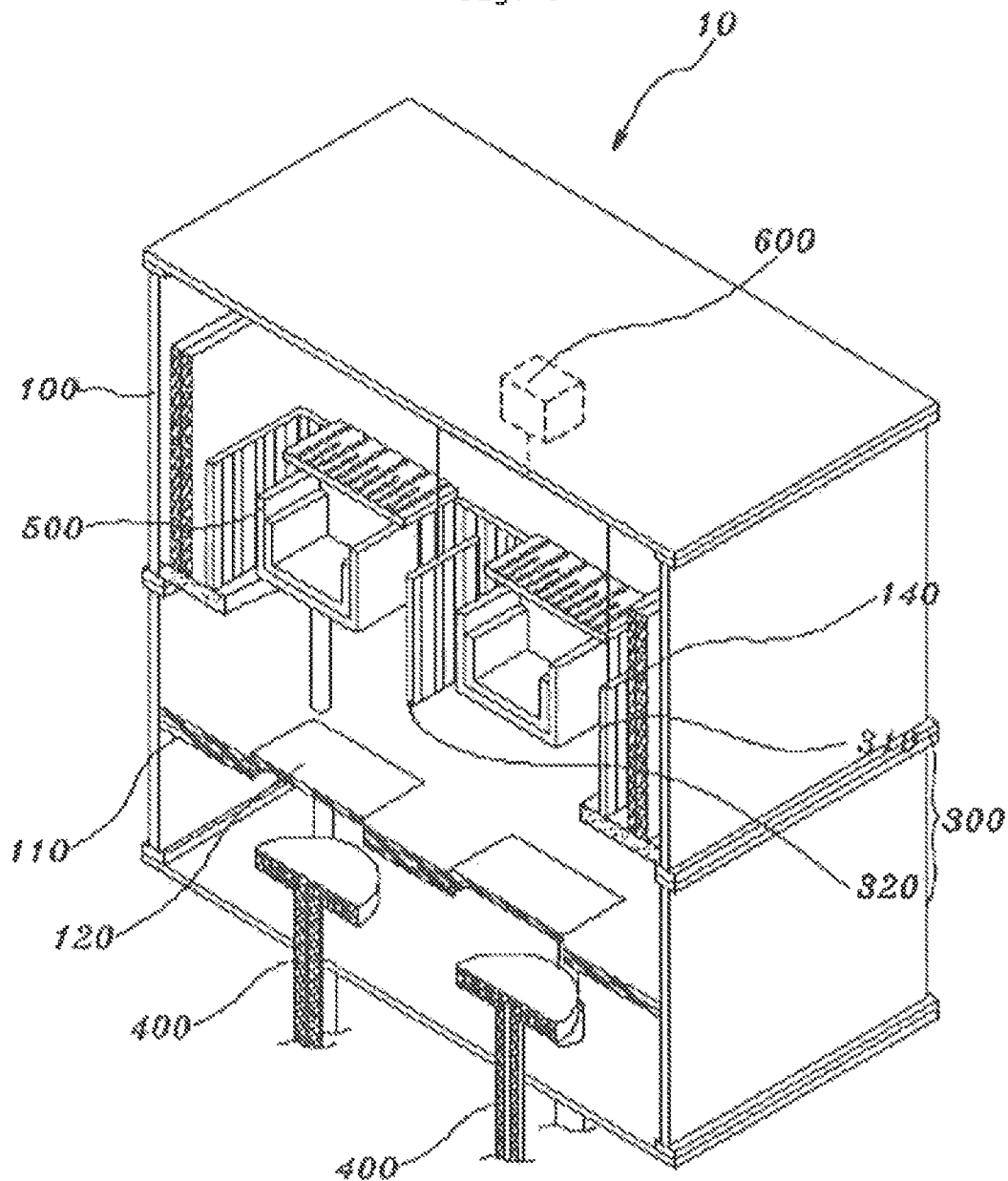

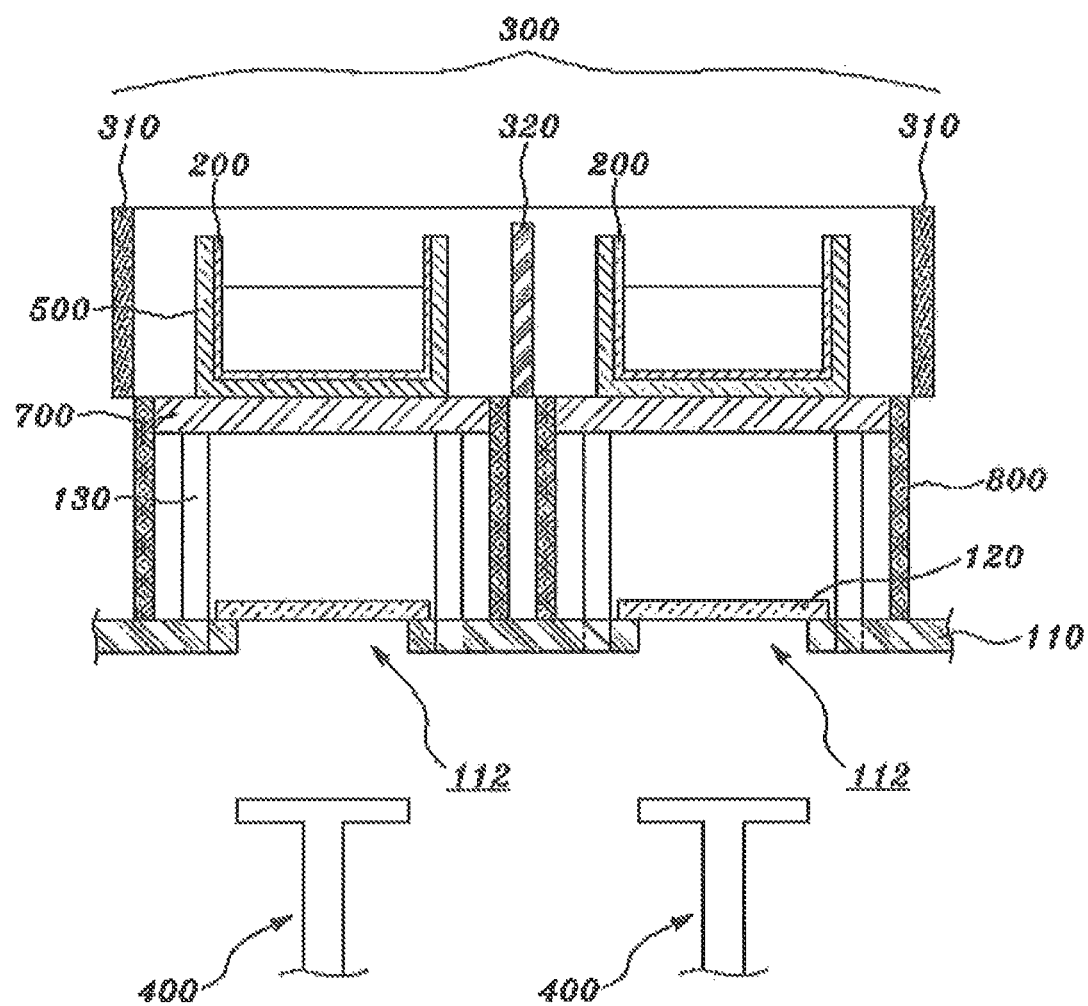

//HIGH-OUTPUT APPARATUS FOR MANUFACTURING A POLYCRYSTAL SILICON INGOT FOR A SOLAR CELL

CROSS-REFERENCE TO RELATED APPLICATIONS

This patent application is a U.S. national phase under 35 U.S.C 371 of PCT/KR2011/002357 filed on Apr. 5, 2011, which claims the benefit of priority from Korean Patent Application No. 10-2010-0040101, filed on Apr. 29, 2010, the contents of each of which are incorporated herein by reference in its entirety.

TECHNICAL FIELD

The present invention relates to a high-output apparatus for manufacturing a polycrystal silicon ingot, and more particularly, to a high-output apparatus for manufacturing a polycrystal silicon ingot, for a solar cell, the apparatus including a plurality of crucibles, melting and directionally cooling raw silicon filling the plurality of crucibles, capable of simultaneously manufacturing in several ingots for a general time needed to manufacture one ingot.

BACKGROUND ART

Recently, solar photovoltaic power generation using crystalline silicon solar cells passes a test stage and attains a commercialization stage due to advantages thereof such as pollution-free, safety, high performance, and reliability.

As a result thereof, in several nations such as German, Japan, and Korea, high capacity of solar photovoltaic power generation is performed to several thousands to several ten thousands kW.

Currently, solar cells used in solar photovoltaic power generation are manufactured generally using one of single crystal ingots manufactured by Czochralski method and polycrystal silicon ingots manufactured by Bridgman method. To continuously increase large-scale capacity and economical feasibility, it is considered to more lower the cost of silicon ingots and substrates and to increase productivity.

On such grounds, particularly, there are provided a lot of efforts to efficiently produce polycrystal silicon ingots whose properties are not largely deteriorated rather than that of single crystals, capable of reducing cost thereof.

Manufacturing polycrystal silicon ingots for a solar cell basically has "directional solidification" as properties.

A crucible manufactured using one of quartz and graphite is filled with raw silicon for solar cells. The raw silicon is melted at a temperature of 1420° C. or more and heat of solidification of silicon is removed in a certain direction toward a bottom of the crucible, thereby spreading solidification from the bottom of the crucible to a top of the crucible, which is a directional solidification process.

Ingots obtained as a result of a well-controlled directional solidification process has a columnar structure in which a large number of single crystal columns are coupled with one another in one direction in such a way that there is provided a structure capable of collecting electrons generated by photos toward an electrode without loss, identical to single crystals, when manufacturing a substrate vertical, to a crystal growth direction.

General polycrystal silicon ingots for solar cells with commercial scale have a size of about 400 to 450 kg. To embody high quality, general polycrystal silicon ingots are manufactured one by one at a time in a batch. Generally, there are required a long process for two days or more, a large amount of power consumption, and expensive installation costs.

Technical core is to manufacture polycrystal ingots suitable for solar cells by melting and directionally solidifying raw silicon, whose crystal structure is a columnar structure, whose grain size is large, having a high quality, in which crystalline defects and impurities are less enough.

To embody this, it is required to accompany an optimal design for a heater forming a hot zone of an apparatus for manufacturing ingots, an insulator, a bottom heat transfer system for directional solidification, inert gas, a vacuum system, coated crucibles, a system against a leakage of melted silicon, and optimization of variables in process such as silicon melting and solidification speed and heat treatment speed.

Technical developments in the art have focused on embodying the quality of ingots and also increasing productivity and economic feasibility by promoting improvements in such apparatuses and processes.

In such situation, a primary direction of present technology development is to more increase a size of ingots produced in a batch at a time. However, as another way to increase productivity and reduce cost, there may be considered a way of producing a plurality of ingots in a batch at a time. Thereupon, an aspect of the present invention is to provide a new apparatus for manufacturing ingots and a method of using the apparatus, the apparatus capable of producing a plurality of ingots simultaneously with the same process time, and to provide additional technologies according thereto.

DISCLOSURE

Technical Problem

When producing a plurality of ingots in a batch at a time without increasing a general process time for each batch, not only the entire installation cost but also operating cost according to melting, solidifying, and heat-treating silicon may be greatly reduced. To technically embody this, it is required to solve new problems as follows.

First, it is required to provide uniformity of the same quality among a plurality of ingots.

Generally, since a polycrystal silicon substrate for solar cells is manufactured using a small size of several bricks formed by dividing one large size polycrystal silicon ingot, it is important to reduce a quality difference among the bricks.

When manufacturing a plurality of ingots at a time, it is required to maintain all elements of an installation and process to be symmetrically identical to reduce a quality difference among the plurality of ingots.

Second, it is required to reduce a danger of operating a plurality of crucibles and to provide safety of an installation and operators thereof.

A generally used crucible formed of one of quartz and graphite may be cracked occasionally in an environment of manufacturing the polycrystal silicon ingots according to the present invention with a high temperature of 1500° C., a great temperature change, and a great pressure change of vacuum and inert atmosphere, thereby leaking melted silicon Liquid.

In this case, there may occur a great problem in safety while in contact with metallic surface inside an installation or an insulator.

There exists a danger of explosion of the installation due to a leakage and rapid evaporation of cooling water caused by a damage of a surface while silicon liquid of high temperature is in direct contact with an internal part of a chamber formed of steel.

Such problems may also occur in general single ingot manufacturing apparatuses in which the operation of an apparatus is stopped to prevent a danger. However, in case of the plurality of crucibles according to the present invention, a yield grade is reduced due to simultaneously discarding a normal crucible.

Accordingly, though there is a problem in one among a plurality of crucibles and there occurs a leakage of silicon, it is required to maintain ingots in other crucibles to the end of a process to decrease reduction of yield grade and also to isolate and keep the leaked silicon in a bottom of a damaged crucible to be solidified and safe to the end.

Thereupon, to solve such problems, the present invention provides an apparatus for producing a plurality of polycrystal silicon ingots at a time, the apparatus including a plurality of crucibles, a heating system capable of uniformly heating each crucible and stably maintaining a required process temperature, a cooling system and an insulation system needed for directional solidification, and a safe isolation system for melted silicon leaked in case of emergency.

Technical Solution

According to an aspect of the present invention, there is provided an apparatus for manufacturing a plurality of silicon ingots by simultaneously heating a vacuum chamber, a plurality of crucibles filled with raw silicon and supporters, installed inside the vacuum chamber, and melting and directionally solidifying the raw silicon, the apparatus including: a plurality of protective plates that are isolations, installed on the outside of the supporter for the crucible, preventing a leakage of silicon liquid and restraining heat of solidification of the silicon liquid to be removed; the plurality of crucibles installed horizontally inside the vacuum chamber, arranged to be separated from one another, and filled with the raw silicon, respectively, to manufacture polycrystal silicon ingots; a heating system installed outside the plurality of crucibles to melt the raw silicon in each of the plurality of crucibles by heating the plurality of crucibles; and coolers cooling the crucibles to solidify the raw silicon melted by the heating system, to grow polycrystal ingots.

Preferably, in the vacuum chamber, there is a space formed in a square shape in which four crucibles are arranged in each area formed based on an imaginary cross line passing an intermediate point of the space.

Also, the crucible is fastened by the crucible supporter and the plurality of protective plates preventing a leakage of silicon liquid are installed outside the crucible supporter to be capable of using silicon in a crucible not damaged while some crucibles are damaged in a process of manufacturing a plurality of ingots and to function as a perfect insulation system for all parts of the crucible except for a bottom thereof to restrain the heat of solidification of silicon to the bottom of the crucible to be removed, thereby allowing one directional removal in such a way that the whole yield rate may be improved by increasing a fraction of a columnar structure controlling properties of polycrystal ingots for solar cells.

Also, the heating system includes an external heater heating a surface of each crucible, facing an inner surface of the vacuum chamber, and internal heaters heating a surface of each crucible, facing one another adjacent crucible.

The internal heaters are provided in a cross shape according to the imaginary cross line, between the surfaces of the crucibles facing one another.

Also, each of the internal heaters is formed in the shape of one of a plate formed by bending a heating pipe plural times and a plurality of arranged bars to correspond to the surface of the crucible.

There is further included a controller capable of operating the external heater and the respective internal heaters, respectively, and controlling a temperature for each other.

Also, the coolers are provided at the bottom of the plurality of crucibles and cool the plurality of crucibles at the same time.

The coolers are provided at bottoms of the respective crucibles and cool the respective crucibles.

Also, there are installed a plurality of supporters on the outside the respective crucibles and one or more of protective plates preventing a leakage around the supporters.

Advantageous Effects

As described above, according to a high-output apparatus for manufacturing polycrystal silicon ingots for solar cells according to the present invention, a temperature of each of an external heater and internal heaters included in a heating system is controlled respectively and a plurality of crucibles are uniformly heated, thereby producing a plurality of ingots for a process time similar to a general process time, also a safe isolation system for a leakage of melted silicon in emergency is provided to prevent a damage in an installation and a danger of explosion, and it is possible to maximize a fraction of a columnar structure of an ingot suitable for a high efficient solar cell, by one-directionally controlling heat of solidification of silicon liquid.

BRIEF DESCRIPTIONS OF THE DRAWINGS

FIG. 5 is a view illustrating a heating system of the apparatus for manufacturing polycrystal silicon ingots for solar cells according to another embodiment of the present invention; and FIG. 6 is a view illustrating a protective plate preventing a leakage of silicon liquid of the apparatus for manufacturing polycrystal silicon ingots for solar cells according to an embodiment of the present invention.

BEST MODEL

Hereinafter, exemplary embodiments of the present invention will be described with reference to the attached drawings.

However, following embodiments are just examples of the present invention and the present invention will not be limited thereto and it is possible to make various changes within a range not departing from the technical substance thereof.

Also, the exemplary embodiments do not limit the scope of a right of the present invention and are just for examples and it is possible to make various changes within a range not departing from the technical scope thereof.

Figure 1:
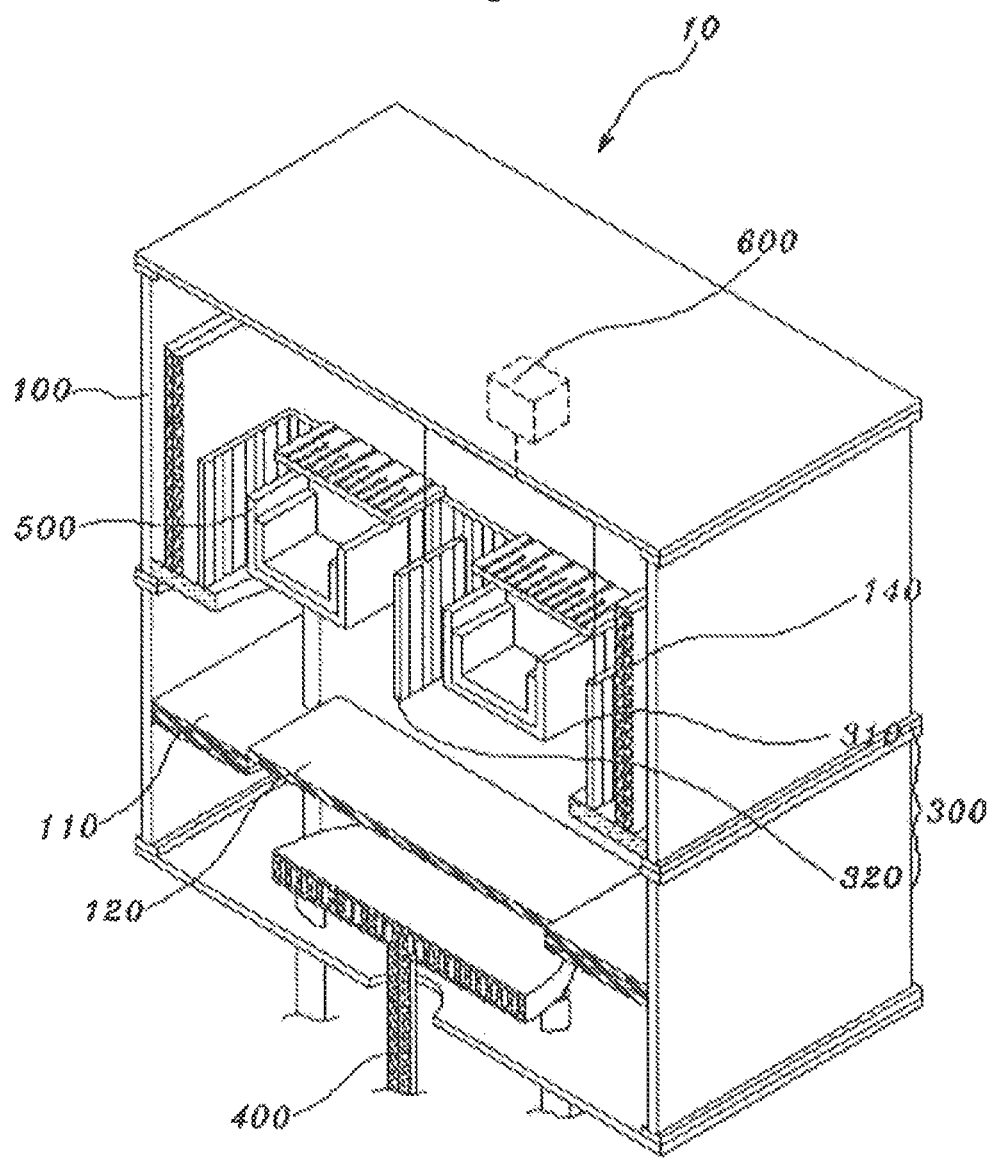
FIG. 1 is a view illustrating a high-output apparatus for manufacturing polycrystal silicon ingots for solar cells according to an embodiment of the present invention.
Figure 2:
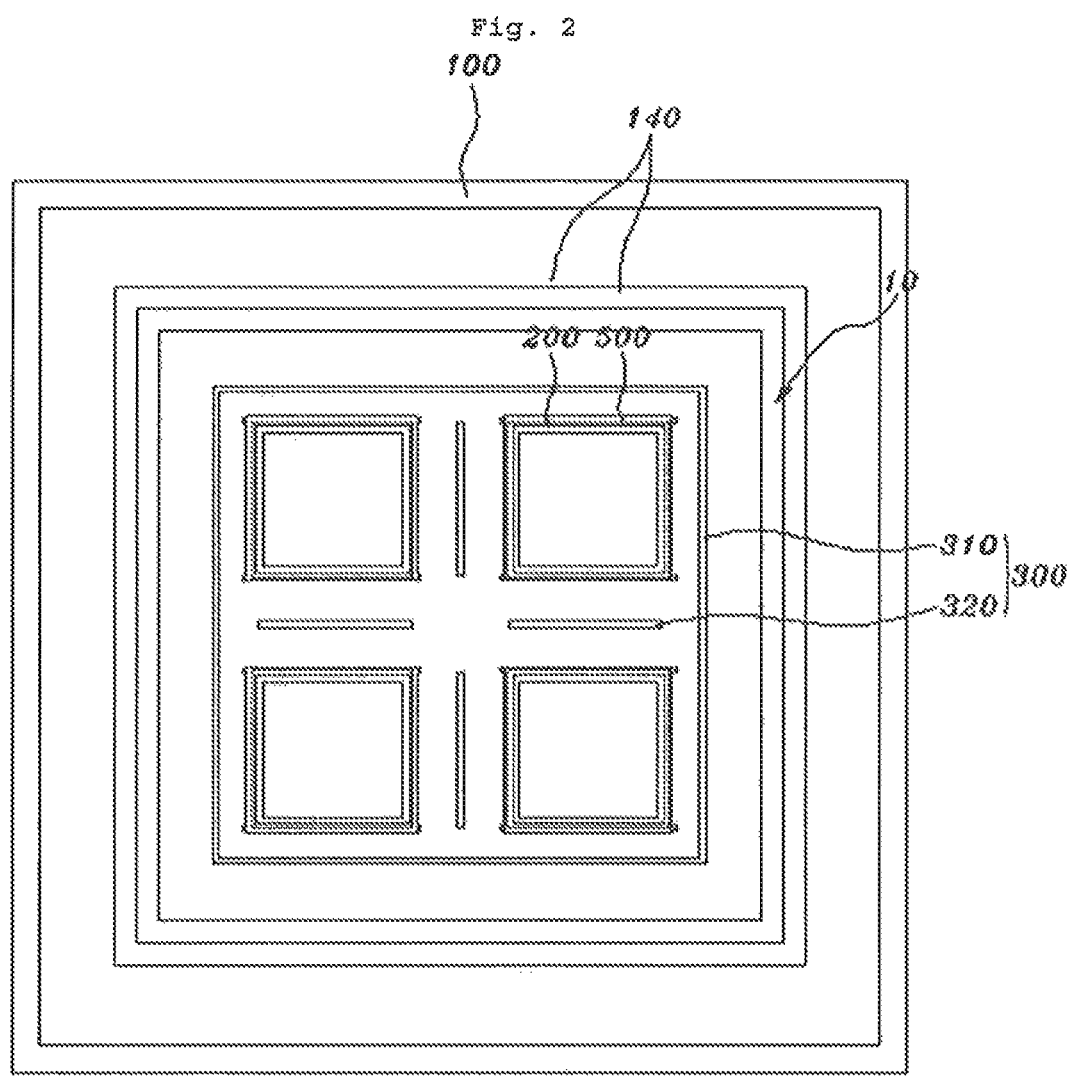
FIG. 2 is a to view illustrating the apparatus for manufacturing polycrystal silicon ingots for solar cells according to an embodiment of the present invention.
Figure 3:
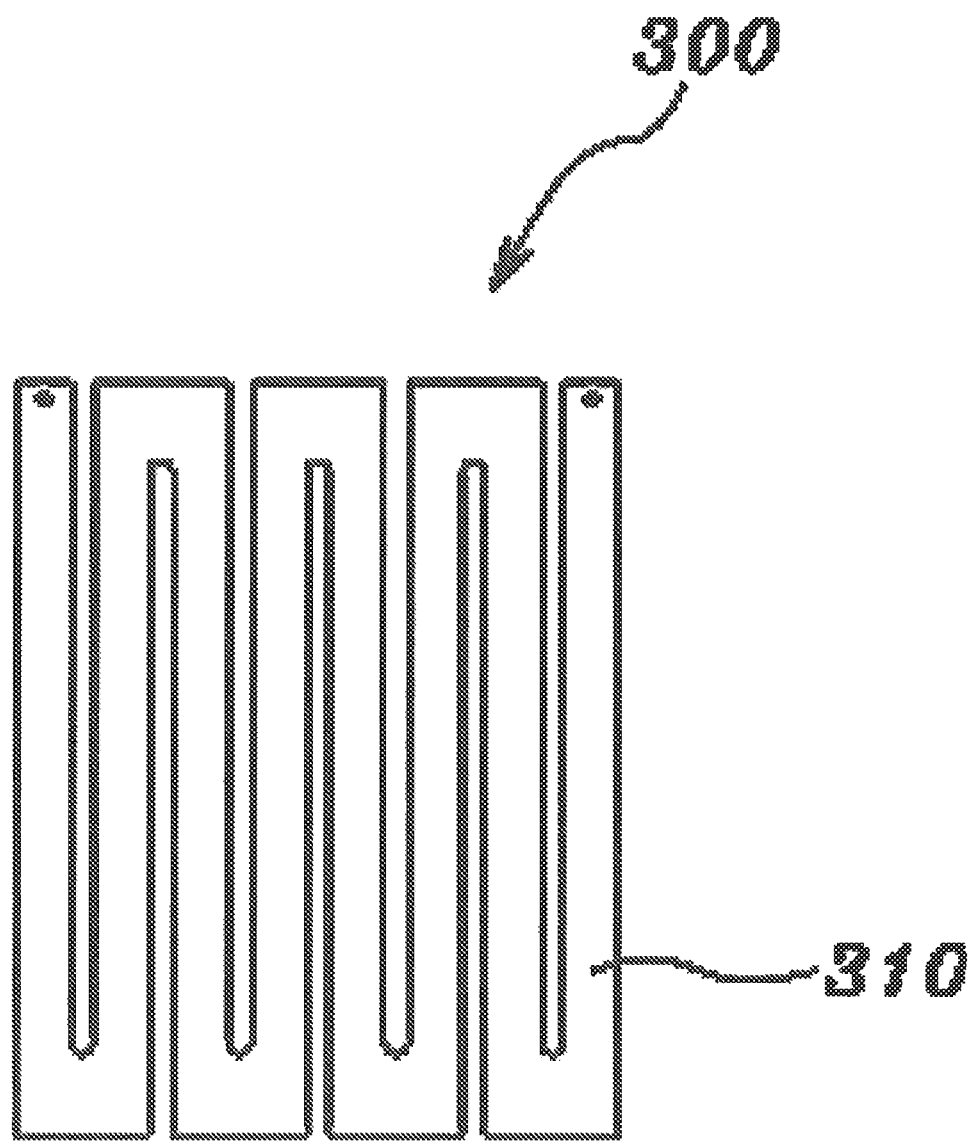
FIG. 3 is a view illustrating a heating system of the apparatus for manufacturing polycrystal silicon ingots for solar cells according to an embodiment of the present invention.
Figure 4:
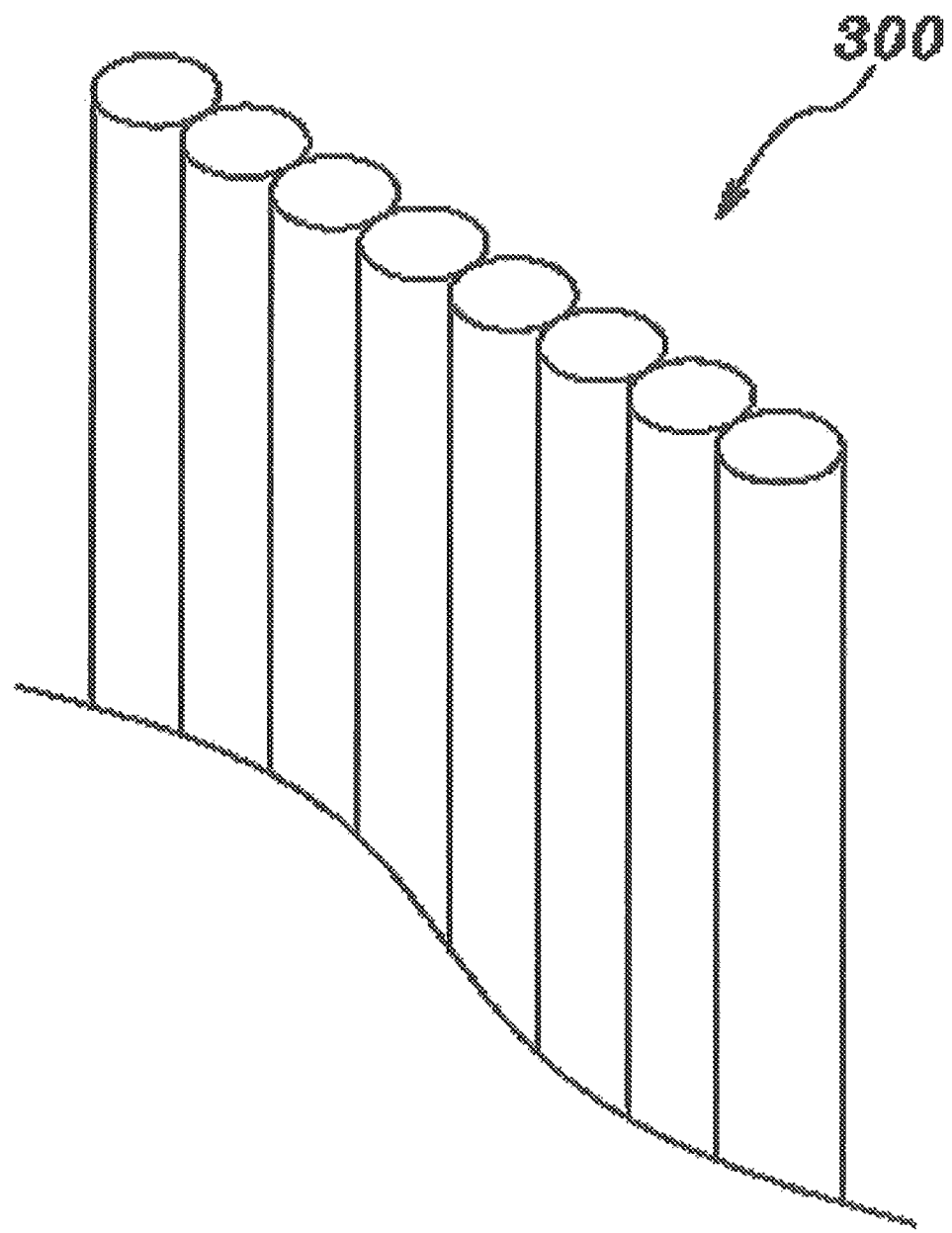
FIG. 4 is a view illustrating an apparatus for manufacturing polycrystal silicon ingots for solar cells according to another embodiment of the present invention.

FIG. 1 is a view illustrating a high-output apparatus for manufacturing polycrystal silicon ingots for solar cells according to an embodiment of the present invention;

FIG. 2 is a top view illustrating the apparatus for manufacturing polycrystal silicon ingots for solar cells according to an embodiment of the present invention;

FIG. 3 is a view illustrating a heating system of the apparatus for manufacturing polycrystal silicon ingots for solar cells according to an embodiment of the present invention;

FIG. 4 is a view illustrating an apparatus for manufacturing polycrystal silicon ingots for solar cells according to another embodiment of the present invention;

FIG. 5 is a view illustrating a heating system of the apparatus for manufacturing polycrystal silicon ingots for solar cells according to another embodiment of the present invention; and FIG. 6 is a view illustrating a protective plate installed around supporters for crucibles and collecting silicon liquid leaked due to a damage of the crucible while melting and cooling raw silicon filling the crucible.

Since such protective plate keeps the inside of the apparatus being perfectly sealed together with a side insulator outside a heater and a bottom insulator at a bottom of the crucible, though silicon liquid is leaked due to a damage in the crucible, it is possible to protect a chamber by perfectly preventing a leakage outside.

In addition, all surfaces except for the bottom of the crucible are perfectly insulated in such a way that heat of solidification of melted silicon is restrained to the bottom of the crucible to be removed, thereby facilitating one directional removal to increase a fraction of a columnar structure controlling properties of polycrystal ingots for solar cells and to improve the entire yield rate.

As shown in the drawings, a high-output apparatus 10 for manufacturing polycrystal silicon ingots for solar cells manufactures polycrystal silicon ingots by heating, melting, and cooling raw silicon inside a vacuum chamber 100.

In this case, in the vacuum chamber 100, there are included a plurality of crucibles 200 where raw silicon fills each thereof to manufacture polycrystal silicon ingots, the crucibles 200 are arranged horizontally to be separated from one another.

Such crucibles 200 are surrounded with susceptors 500, respectively, each of the susceptors 500 is fastened inside the vacuum chamber 100 by a supporter (not shown), and there are provided insulators (not shown) to shield heat discharged around each of the crucibles 200.

The susceptor 500 protects the crucible 200, easily conducts heat or a chill, transferred from the outside, to the crucible 200, and is formed of one of carbon and graphite with excellent heat transmission.

The crucible 200 is formed of one or more of quartz and graphite.

The heating system 300 is provided outside of each of the crucibles 200 to heat each of the crucibles 200 to melt raw silicon filling the crucibles 200 and transmits radiant heat, thereby melting the raw silicon filling each of the crucibles 200.

Also, cooler 400 is provided to cool each of the crucibles 200 and cools each of the crucibles heated by the heating system 300, thereby cooling the melted raw silicon to be grown as polycrystal.

Between the heating system 300 and the cooler 400, there are included an insulating layer 110 with transfer channels 112 formed thereon and a shielding door 120 opening and shutting the transfer channels 112, the shielding door 120 provided at a bottom of each of the crucibles 200 and selectively dividing the vacuum chamber 100 together with the insulating layer 110.

That is, when heating the crucibles 200 for melting the raw silicon, to maintain a temperature of the heating system 300 and reducing a heating time, the vacuum chamber 100 is divided by the shielding door 120 into an area where the heating system 300 and the crucibles 200 are located in and an area where the cooler 400 is located in.

In this case, referring to FIG. 2, since including a space formed in a square shape, the vacuum chamber 100 may be entirely formed in a square shape to form the quadrangular space and improve heat efficiency.

There are provided four crucibles 200, and each of the crucibles 200 is arranged in each of areas formed by dividing based on an imaginary cross line passing an intermediate point of the space of the vacuum chamber 100.

Each of the crucibles 200 is installed in such a way that a surface thereof is separated from one another at a certain interval.

The heating system 300 includes an external heater 310 and internal heaters 320 heating the crucibles 200 by transmitting radiant heat to respective surfaces of each of the crucibles 200.

That is, the external heater 310 is provided to heat a surface of each of the crucibles 200, facing an internal side of the vacuum chamber 100, and the internal heaters 320 are provided to heat a surface of each of the crucibles 200, opposite to one another, respectively.

In this case, there are provided four internal heaters 320 in a cross shape formed according to the imaginary cross line to be located between the surfaces of each of the crucibles 200, opposite to one another, respectively.

Accordingly, radiant heat is transmitted to all surfaces of the four crucibles 200 by the external heater 310 and the internal heaters 320, thereby melting the raw silicon filling each of the crucibles 200.

Referring to FIG. 3, the external heater 310 and the internal heaters 320 are formed in the shape of a plate formed by bending a heating pipe plural times and heat the susceptors 500 by generating high heat using power supplied via an electrode (not shown), and the heated susceptors 500 transmit the heat to the crucibles 200 to melt the raw silicon therein.

On the other hand, referring to FIG. 4, the external heater 310 and the internal heaters 320 are formed in the shape of a plurality of bars arranged to face the surface of the crucible 200 and heat the susceptors 500 by generating high heat using power supplied via an electrode (not shown), and the heated susceptor 500 transmit the heat to the crucibles 200 to melt the raw silicon therein.

As described above, to operate the external heater and the internal heaters, respectively, and control a temperature of each of the external heater 310 and the internal heaters 320 formed in the shape of one of the plate formed by bending a heating pipe plural times and the plurality of arranged bars, there is further included a controller 600 capable of controlling and maintaining a melting temperature of each of the crucibles 200, thereby simultaneously melting the raw silicon in the plurality of crucibles 200 for a process time similar to a general process time.

The cooler 400 is provided at the bottom of the plurality of crucibles 200 and cools the plurality of crucibles at the same time, thereby cooling and growing the melted silicon in each of the crucibles 200 to be polycrystal ingots having a columnar structure.

On the other hand, the coolers 400, as shown in FIG. 5, may be provided at the bottom of each of the crucibles 200 and may cool each of the crucibles 200, respectively.

This is for cooling a temperature of each of the crucibles 200, and it is preferable to cool the respective susceptors 500 to cool the respective crucibles 200, thereby improving cooling efficiency.

Accordingly, respective polycrystal silicon ingots are manufactured in the plurality of crucibles 200, thereby improving productivity at least three times or more than that of general apparatuses.

Also, referring to FIG. 6, in case of the present invention in which the plurality of ingots are manufactured using the plurality of crucibles 200, there are further included crucible supporters 700 and a protective plate 800 preventing a leakage, between the crucible supporters 700 and the insulating layer 110.

The protective plate 800 preventing a leakage is provided as one or more and shields a transfer section of the cooler 400 to prevent the silicon liquid in the crucible 200 from being leaked to the transfer section of the cooler 400.

Also, the protective plate 800 preventing a leakage seals the bottom of the crucible 200, through which the cooler 400 moves, to perform heat exchange only between the cooler 400 and the bottom of the crucible 200, thereby cooling the melted silicon in the crucible 200 from the bottom to a top thereof to be sequentially solidified.

In other words, the protective plates 800 preventing a leakage keeps the inside of the vacuum chamber 100 perfectly sealed, together with a side insulator 140 and an insulating layer 110 at the bottom of the crucible 200.

Accordingly, it is possible to one directionally remove the heat of solidification with respect to the melted silicon in the crucible 200 in such a way that additional yield rate may be improved by increasing a fraction of a columnar structure controlling properties of polycrystal ingots for solar cells.

Also, it is possible to prevent a leakage of the silicon liquid through the transfer channels 112 of the insulating layer 110, capable of occurring in a process of melting and cooling the raw silicon of a solid phase filling the crucible 200.

The protective plate 800 preventing a leakage may be formed of graphite.

The invention claimed is:

1. A high-output apparatus for manufacturing polycrystal silicon ingots for solar cells by heating, melting, and cooling raw silicon filling a crucible inside a vacuum chamber, the apparatus comprising:

a plurality of crucibles arranged horizontally to be separated from one another in the vacuum chamber, each of which the raw silicon fills, to manufacture polycrystal silicon ingots;

a heating system provided outside the respective crucibles and heating the respective crucibles to melt the raw silicon therein;

a cooler cooling the crucibles to cool and grow silicon melted by the heating system to polycrystal ingots;

crucible supporters installed to support the respective crucibles from below; and one or more protective plates preventing a leakage to seal a transfer section of the cooler between the crucible supporters and an insulating layer, wherein the crucibles and the cooler are disposed in different chambers, the different chambers are connected through a transfer channel, and a shielding door is provided at the transfer channel so that the shielding door can open and close the transfer channel.

2. The apparatus of claim 1, wherein the vacuum chamber includes a space formed in a square shape, and wherein there are provided four crucibles in areas formed based on an imaginary cross line passing an intermediate point of the space, each of the crucibles arranged in each of the areas.

3. The apparatus of claim 2, wherein the heating system comprises:

an external heater heating a surface of each of the crucibles, the surface facing an internal side of the vacuum chamber; and internal heaters, each of which heats a surface of each of the crucibles, the surface facing one another surface of the crucibles.

4. The apparatus of claim 3, wherein the internal heaters are provided in a cross shape according to the imaginary cross line, between the surfaces of the crucibles, facing one another.

5. The apparatus of claim 4, wherein the internal heaters are formed to be one of a plate formed by bending a heating pipe plural times and a plurality of arranged bars to correspond to the surface of the crucible.

6. The apparatus of claim 4, wherein the external heater and the internal heaters further comprise a controller to control operation and temperature thereof.

7. The apparatus of claim 2, wherein the cooler is under the plurality of crucibles and cools the plurality of crucibles at the same time.

8. The apparatus of claim 2, wherein the cooler is under one of the crucibles, another cooler is under another of the crucibles, and each of the coolers cools each of the crucibles.

9. The apparatus of claim 1, wherein the protective plates are formed of graphite.

* * * * *